(12) United States Patent
Banna

(10) Patent No.: US 7,648,898 B2
(45) Date of Patent: Jan. 19, 2010

(54) METHOD TO FABRICATE GATE ELECTRODES

(75) Inventor: Srinivasa R. Banna, San Jose, CA (US)

(73) Assignee: DSM Solutions, Inc., Los Gatos, CA (US)

( * ) Notice: Subject to any disclaimer, the term of this patent is extended or adjusted under 35 U.S.C. 154(b) by 19 days.

(21) Appl. No.: 12/033,487

(22) Filed: Feb. 19, 2008

(65) Prior Publication Data

US 2009/0206336 A1 Aug. 20, 2009

(51) Int. Cl.
*H01L 21/3205* (2006.01)

(52) U.S. Cl. .................. 438/585; 438/626; 438/637; 257/E21.444

(58) Field of Classification Search ............. 438/585, 438/637, 626, 631; 257/E21.444, 382, 412
See application file for complete search history.

(56) References Cited

U.S. PATENT DOCUMENTS

| | | | |
|---|---|---|---|
| 5,015,596 A | 5/1991 | Toyoda et al. .............. 437/41 |
| 6,091,100 A * | 7/2000 | Wu ............................ 257/315 |
| 6,380,027 B2 * | 4/2002 | Furukawa et al. ............ 438/241 |
| 7,115,525 B2 * | 10/2006 | Abatchev et al. ............ 438/725 |
| 7,214,601 B2 | 5/2007 | Zeng et al. .................. 438/486 |
| 7,230,283 B2 | 6/2007 | Ohyanagi et al. ............ 257/133 |
| 7,268,378 B1 | 9/2007 | Yu et al. ...................... 257/256 |
| 7,314,799 B2 | 1/2008 | Merrett et al. .............. 438/268 |
| 2008/0308816 A1 | 12/2008 | Miller et al. ................ 257/76 |

FOREIGN PATENT DOCUMENTS

WO WO 2007/146872 A2 12/2007
WO WO 2008/008764 A2 1/2008

OTHER PUBLICATIONS

*Ion-Implantation Ranges And Standard Deviations*; Appendix D9; XP-007907940; pp. 623-625, Jan. 1, 2002.
*PCT Notification of Transmittal of the International Search Report and the Written Opinion of the International Searching Authority* for International Application No. PCT/US2009/033209; 13 pages, Apr. 3, 2009.

* cited by examiner

*Primary Examiner*—Michael Trinh
(74) *Attorney, Agent, or Firm*—Baker Botts L.L.P.

(57) ABSTRACT

A method for fabricating a semiconductor device comprises depositing a first layer of oxide on at least a portion of a channel of a transistor. The method further comprises depositing a layer of nitride on the first layer of oxide and etching at least a portion of the layer of nitride to the first layer of oxide. The method further comprises depositing a second layer of oxide and planarizing the oxide to expose at least a portion of the layer of nitride. The method further comprises stripping at least a portion of the layer of nitride to create one or more notches and removing at least a portion of the first layer of oxide. The method further comprises depositing a layer of polysilicon, wherein at least a portion of the layer of polysilicon is deposited into at least one of the one or more notches.

16 Claims, 4 Drawing Sheets

METHOD TO FABRICATE GATE ELECTRODES

TECHNICAL FIELD

This disclosure relates in general to semiconductor devices, and more particularly to fabricating a transistor.

OVERVIEW

Transistors and other semiconductor devices have become a fundamental building block for a wide range of electronic components. Metal-oxide semiconductor field effect transistors have been the primary choice for transistors in many applications including general use microprocessors, digital signal processors, application specific integrated circuits, and various other forms of electronic devices. With an increasing demand for electronic devices, the inclusion of an oxide layer creates significant limitations to further improvements in the size and the operating speed of such devices. Consequently, the focus of industry development has begun to shift to other types of semiconductor devices. These other devices also present unique challenges and obstacles for engineers and fabrication experts alike.

SUMMARY OF EXAMPLE EMBODIMENTS

In accordance with one embodiment of the present disclosure, a method for fabricating a semiconductor device comprises forming a channel of a transistor, wherein the channel has a first conductivity type. The method further comprises depositing a first layer of oxide on a least a portion of the channel. The method further comprises depositing a layer of nitride on the first layer of oxide. The method further comprises etching the nitride, wherein at least a portion of the layer of nitride is etched to the first layer of oxide. The method further comprises depositing a second layer of oxide on the layer of nitride and the first layer of oxide. The method further comprises planarizing the oxide to expose at least a portion of the layer of nitride. The method further comprises stripping at least a portion of the layer of nitride to create one or more notches and to expose at least a portion of the first layer of oxide. The method further comprises removing at least a portion of the first layer of oxide, and depositing a layer of polysilicon, wherein at least a portion of the layer of polysilicon is deposited into one or more notches created by stripping at least a portion of the layer of nitride.

In accordance with another embodiment of the present disclosure, a semiconductor device comprises a channel of a transistor, wherein the channel has a first conductivity type. The device further comprises a layer of oxide on at least a portion of the channel. The device further comprises gate, source, and drain contacts of a transistor residing on at least a portion of the channel and each separated by a portion of the layer of oxide. The device further comprises one or more flat interfaces between the layer of oxide and the channel in one or more areas between the gate, source, and drain contacts.

In accordance with yet another embodiment of the present disclosure, a semiconductor device is prepared by a process comprising the steps of forming a channel of a transistor, wherein the channel has a first conductivity type. The process further comprises depositing a first layer of oxide on a least a portion of the channel. The process further comprises depositing a layer of nitride on the first layer of oxide. The process further comprises etching the nitride, wherein at least a portion of the layer of nitride is etched to the first layer of oxide. The process further comprises depositing a second layer of oxide on the layer of nitride and the first layer of oxide. The process further comprises planarizing the oxide to expose at least a portion of the layer of nitride. The process further comprises stripping at least a portion of the layer of nitride to create one or more notches and to expose at least a portion of the first layer of oxide. The process further optionally comprises a link implant of a first conductivity type. The process further comprises removing at least a portion of the first layer of oxide. The process further comprises depositing a layer of polysilicon, wherein at least a portion of the layer of polysilicon is deposited into one or more notches created by stripping at least a portion of the layer of nitride. The process further comprises planarizing the polysilicon and at least a portion of the second layer of oxide.

Important technical advantages of certain embodiments of the present disclosure include the ability to create a semiconductor device with less overetch into the channel than with other methods.

Other technical advantages of the present disclosure will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present disclosure and its advantages, reference is now made to the following description, taken in conjunction with the accompanying drawings, in which.

DETAILED DESCRIPTION

When manufacturing certain semiconductor devices, etching may be done to remove sections of material, such as oxide or polysilicon, in order to form one or more components of a transistor. At times it is necessary to "overetch" into a channel of a transistor so that the material being etched is completely removed. However, this overetching can decrease the width of a transistor channel and in some instances can even completely cut off the channel. Certain embodiments of the present disclosure can provide for a thin-channel device created without cutting off the channel during manufacturing.

Figure 1:
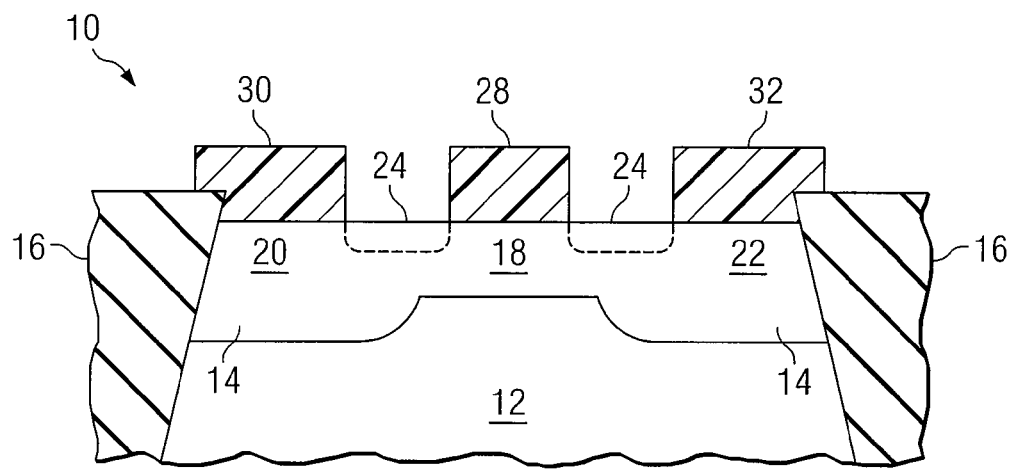
FIG. 1 illustrates a semiconductor device.

FIG. 1 illustrates an example of a semiconductor device 10 manufactured according to a particular embodiment of the present disclosure. FIG. 1 is illustrative only, and is not necessarily to scale. The components of FIG. 1 may also be arranged in other configurations and still fall within the scope of the disclosed embodiments. FIG. 1 illustrates semiconductor device 10 which comprises a well 12, and a channel 14 formed on the well 12. Well 12 and channel 14 can be either N-type or P-type. Channel 14 can be comprised of any bulk semiconductor material to which dopants can be added to form various conductivity regions. Channel 14 may be formed of any suitable semiconductor material such as materials from group 3 and group 5 of the periodic table. In particular embodiments, channel 14 is formed of single crystal silicon. Channel 14 provides a path to conduct current between a source region 20 and a drain region 22 in certain example embodiments. Channel 14 may also include gate region 18. In certain embodiments, channel 14 is a P-type channel and may be doped by particles of P-type doping material such as boron, gallium, indium, or any other suitable P-type dopant. In alternative embodiments, channel 14 may be an N-channel and may be doped by particles of N-type doping material such as antimony, arsenic, phosphorous, or any other appropriate N-type dopant. In certain embodiments, channel 14 can be doped to a concentration of $2.0 \times 10^{11}$ atoms/cm$^2$ to $1.0 \times 10^{14}$ atoms/cm$^2$. In some embodiments, channel 14 may be formed by epitaxial growth of silicon or silicon alloys.

In certain embodiments of semiconductor device 10, a shallow trench isolation ("STI") structure may be formed. Shallow trench isolation comprises etching a pattern of trenches in the silicon and depositing silicon dioxide to fill the trenches. The excess dielectric can then be removed with a technique such as planarization. Shallow trench isolation may be used in certain embodiments to prevent electrical current leakage between adjacent semiconductor device components. In FIG. 1, dielectric 16 may be patterned into an STI structure for use with semiconductor device 10.

As one example, semiconductor device 10 may also comprise a source contact 30, a gate contact 28, and a drain contact 32 of a JFET device. These components may be arranged differently than shown in FIG. 1. In certain existing techniques, these components may be manufactured by depositing a layer of polysilicon on a channel, and then etching the polysilicon into the desired pattern for the semiconductor device. There are a number of ways to do this. In a traditional metal oxide semiconductor (MOS), the polysilicon is etched until a gate oxide is reached. The etcher detects the oxide and knows that all the polysilicon in that area has been removed, so it can stop etching. This prevents etching into the silicon in the channel. In certain devices, all of the polysilicon between pillars needs to be removed so that the pillars are not electrically connected to each other. With some semiconductor devices, such as some JFET devices, there is no gate oxide layer beneath the polysilicon. While these devices are being manufactured an etcher cannot use oxide as an "etch stop," and another technique may need to be used to make sure that the polysilicon between the pillars is removed. In those cases, a technique may be used called time etching. With time etching, etching is performed for a set amount of time sufficient to etch through the polysilicon. For example, if etching is performed at 30 Å per minute, and 300 Å of polysilicon have been deposited, then running the etcher for ten minutes will etch away all the polysilicon. However, manufacturing processes are not exact, and to be sure that all the polysilicon is removed, the etcher is often run for a greater amount of time, for example 10, 20, or 30 percent longer. This is called "overetching" and is done to ensure the polysilicon between pillars is completely removed. Overetching, in certain circumstances, removes not only the polysilicon but also some silicon material from the channel, because the etcher often cannot distinguish between deposited polysilicon and the silicon material in the channel. With a deep channel device this may not be a problem. But when manufacturing devices with a thin channel, overetching could lead to completely etching through the channel and rendering the device useless ("cutting off" the channel).

FIG. 1 also illustrates one example of overetching into a channel 14. Overetch areas 24, represented by dotted lines, represent one depiction of overetching into channel 14. As can be seen in FIG. 1, if overetch areas 24 are too deep, they may etch completely through channel 14 and into well 12. If this occurs, it could cut off conductivity in the channel between source region 20 and drain region 22 of device 10. Device 10 then might not operate properly. Overetch areas 24 are shown with dotted lines because they are not present when manufacturing a semiconductor using the method described by the current disclosure. Certain embodiments of the present disclosure provide a technique for manufacturing devices with thin channels without cutting off the channel when etching is performed.

One method of manufacturing a device such as semiconductor device 10 with a thin channel is depicted in FIGS. 2A-2K. In particular, the illustrated method can produce a device without overetching that can lead to cutting off the channel. The steps illustrated in FIGS. 2A-2K may be combined, modified, or deleted where appropriate. Additional steps may also be added to the example operation. Furthermore, the described steps may be performed in any suitable order.

Figure 2A:
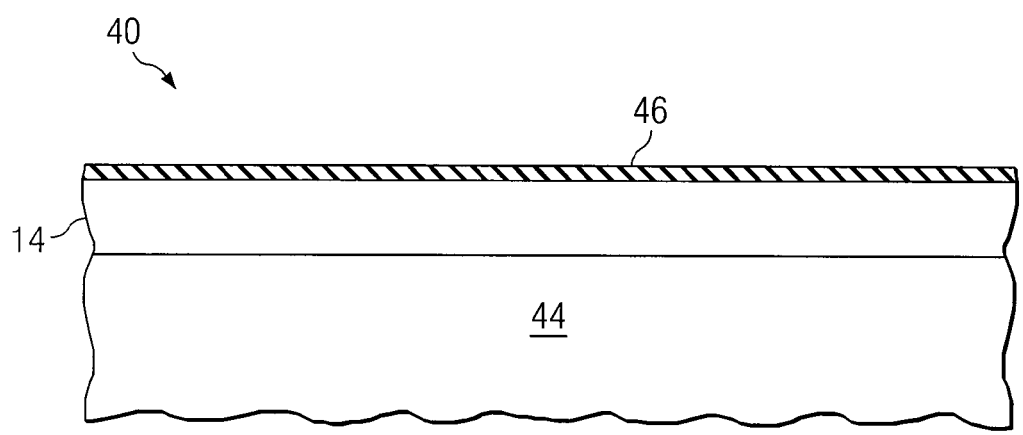
FIGS. 2A to 2K illustrate an example method for manufacturing a semiconductor device.

FIG. 2A begins with device 40, where an STI structure may be formed. FIG. 2A also comprises silicon 44, which may be doped to form a well and/or a channel of a transistor. First layer of oxide 46 is deposited or grown thermally onto at least a portion of silicon 44. First layer of oxide 46 can be deposited on silicon 44 using any suitable method for depositing oxide. As one example, first layer of oxide 46 can be grown using a thermal oxidation process. In certain embodiments, the thickness of first layer of oxide 46 may be 20-125 Å, although thinner or thicker layers may also be used.

Figure 2B:
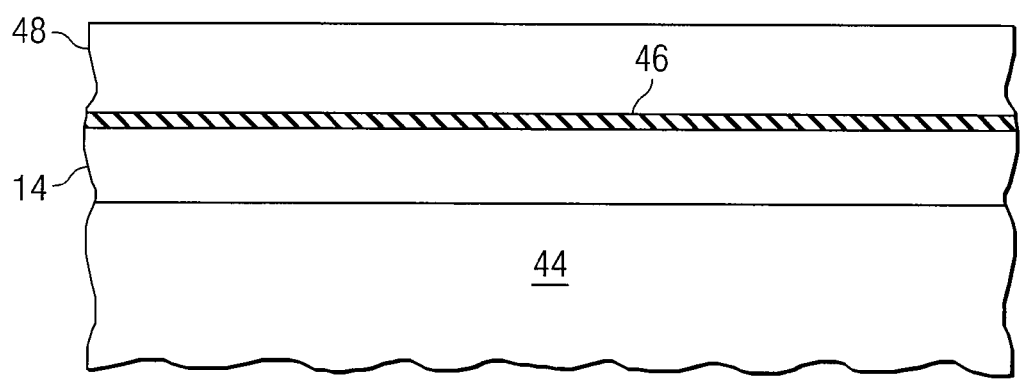

In FIG. 2B, layer of nitride 48 is deposited on first layer of oxide 46. In certain embodiments, the thickness of layer of nitride 48 may be 300-1000 Å. As an example, some embodiments deposit layer of nitride 48 at a thickness equal to the desired thickness of a polysilicon layer plus 300-500 Å. So, for example, if 400 Å of polysilicon is desired, layer of nitride 48 could be 700-900 Å.

Figure 2C:
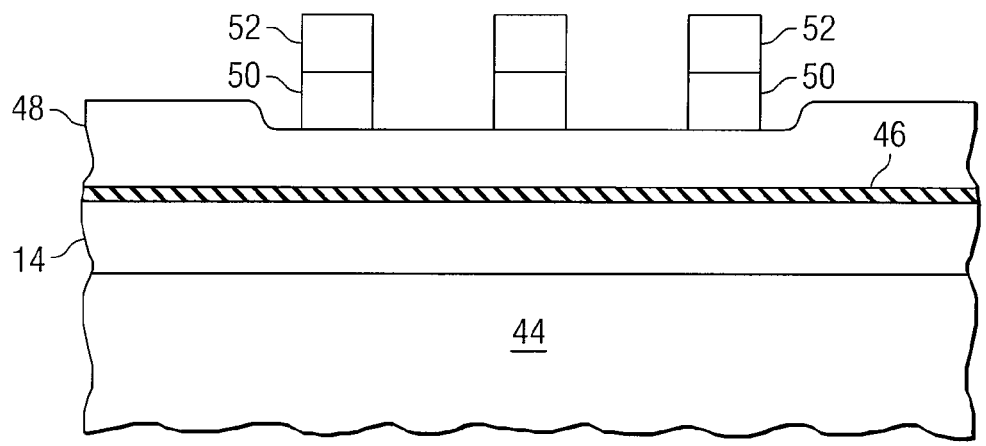

In FIG. 2C, device 40 is prepared for a nitride etch. Portions of layer of nitride 48 will be removed using a nitride etch. However, nitride should be left in the places where polysilicon is desired (for example, where a gate, source, and/or drain of transistor will be placed). Therefore, layer of nitride 48 in other locations may be removed. Layer of nitride 48 can be removed using a dry etch. To protect the areas of layer of nitride 48 where polysilicon is desired, a photoresist 52 can be used. Photoresist 52, in conjunction with antireflective coating (ARC) layer 50, can protect the areas of layer of nitride 48 where polysilicon is desired. In FIG. 2C, as an example, polysilicon is desired in three locations, so photoresist 52 and ARC layer 50 are placed in those three locations. In certain embodiments, photoresist 52 has a thickness of approximately 1900 Å, and ARC layer 50 has a thickness of approximately 800 Å.

Figure 2D:
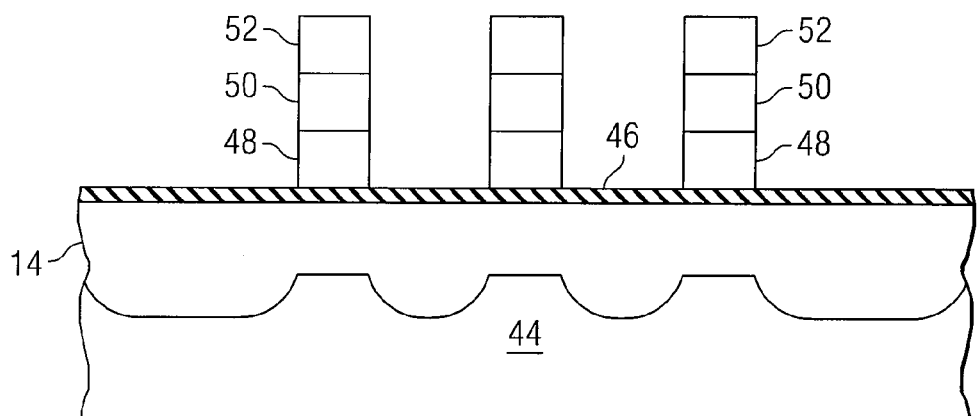

In FIG. 2D, an optional link implant with a first conductivity type can be performed. The unprotected nitride in layer of nitride 48 is etched. In certain embodiments, this is done using a dry etch. A nitride etch may also remove part of first layer of oxide 46. Certain etchers will detect the presence of oxide and use that as an etch stop. To do this, the etcher must remove at least some amount of oxide. The selectivity of nitride to oxide will determine how much oxide is removed when layer of nitride 48 is etched. For example, if the selectivity of nitride to oxide is 20:1, then removing 200 Å of layer of nitride 48 will remove 10 Å of first layer of oxide 46. Thus, the thickness of layer of nitride 48 is related to the thickness of first layer of oxide 46. In certain embodiments, first layer of oxide 46 should be thick enough so that the nitride etch does not overetch through first layer of oxide 46. However, if layer of oxide is too thick, the nitride overetch may etch into an STI dielectric, which could cause other problems. Therefore the thickness of first layer of oxide 46 should be considered when device 40 is being manufactured. FIG. 2D shows that layer of nitride 48 has been removed, except in the locations where it is protected by photoresist 52 and ARC layer 50. Also, some portion of first layer of oxide 46 has been removed during etching, but there still may be some remaining, as shown in FIG. 2D.

Figure 2E:
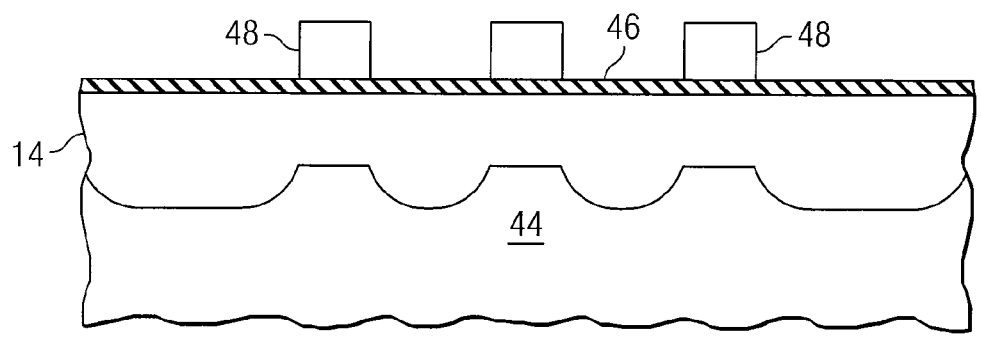

FIG. 2E shows device 40 after the nitride etch has been completed. Photoresist 52 and ARC layer 50 can be removed in this step. Also, first layer of oxide 46 can be removed in this step using an oxide clean. In other preferred embodiments, the remnants of first layer of oxide 46 after the nitride etch can stay and be removed at a later time. In certain embodiments, a wet oxide clean can be performed. Generally, first layer of oxide 46 can be removed without also removing silicon in channel 44. First layer of oxide 46 has not been removed in FIG. 2E. Also, oxide from first layer of oxide 46 will remain below the pillars of nitride 48 that were formed during the nitride etch. This oxide 46 is protected from removal by the layer of nitride 48 over it.

Figure 2F:
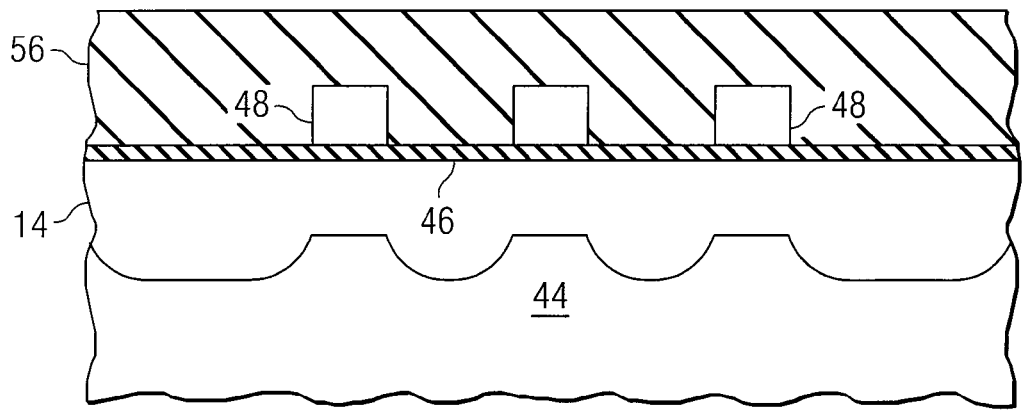

In FIG. 2F, second layer of oxide 56 is deposited or grown on device 40, using any suitable method. In certain embodiments, second layer of oxide 56 has a thickness of approximately 1500 Å. Second layer of oxide 56 can fill the gaps between the pillars of nitride formed during the nitride etch in a previous step. In certain embodiments, second layer of oxide 56 can be deposited using a low temperature process. It can then be densified using a thermal cycle.

Figure 2G:
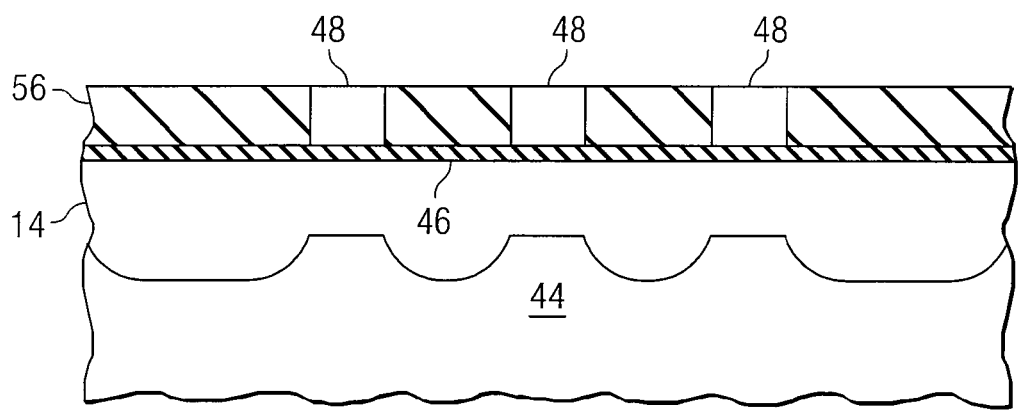

In FIG. 2G, second layer of oxide 56 is polished using a process such as a chemical-mechanical planarization (CMP). A CMP process removes a portion of second layer of oxide 56. In this example, the CMP process removes not only a portion of second layer of oxide 56 but also removes a portion of the pillars of nitride 48. Nitride 48 is used as a stop for the CMP process. In certain embodiments, some nitride 48 will be removed along with some of the second layer of oxide 56. The remaining nitride 48 marks the location where polysilicon can be deposited.

Figure 2H:
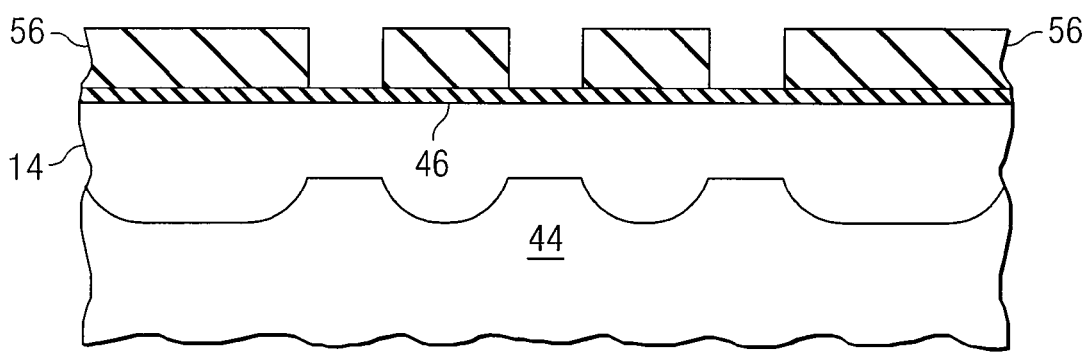

In FIG. 2H, nitride 48 is stripped from device 40 so that polysilicon can later be deposited in one or more of those locations. Nitride 48 can be stripped using any suitable method for removing nitride. Portions of second layer of oxide 56 remain, as do the portions of first layer of oxide 46 that were below nitride 48.

Figure 2I:
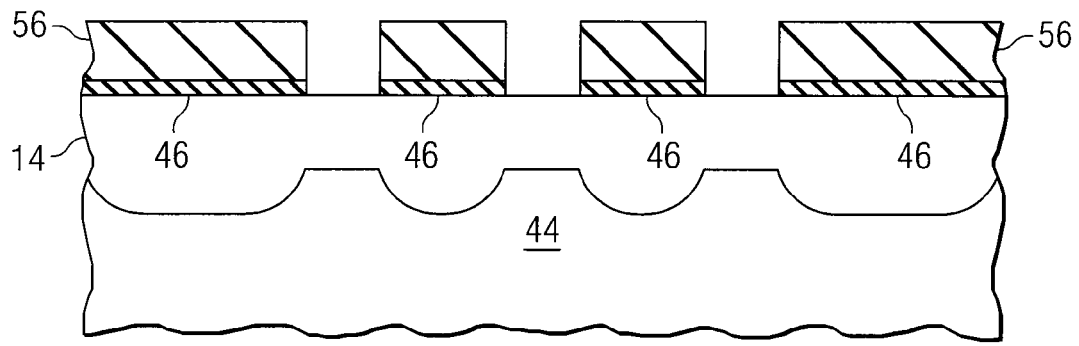

In FIG. 2I, the portions of first layer of oxide 46 that were beneath the pillars of nitride 48 are removed. These portions are removed so that deposited polysilicon can fill the chasms created by the pillars of nitride 48 and also come into contact with silicon 44. First layer of oxide 46 can be removed using any suitable method of removing oxide, such as an oxide clean. In this example embodiment, device 40 now has three chasms that can be filled with polysilicon and used as gate, source, and drain contacts for a transistor.

Figure 2J:
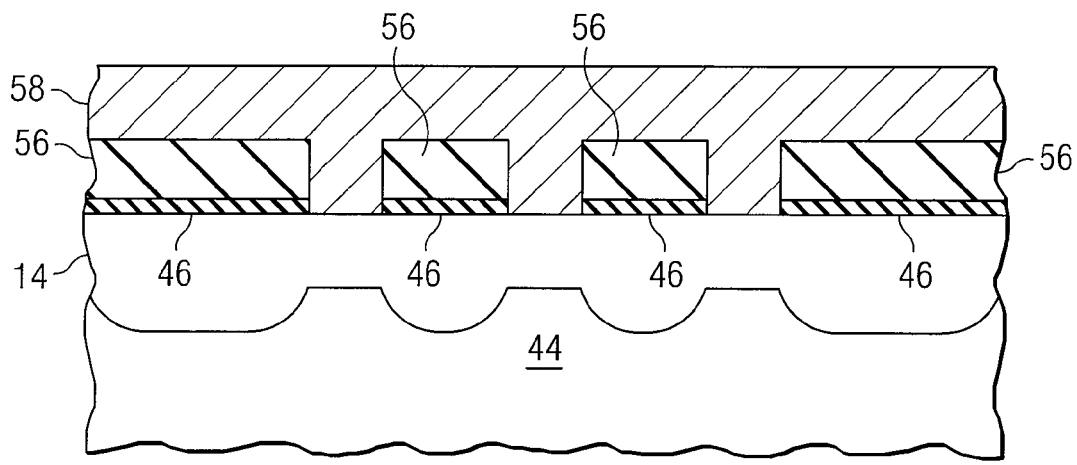

In FIG. 2J, polysilicon 58 is deposited onto device 40, using any suitable method of depositing polysilicon 58. Polysilicon 58 can be used to fill the chasms created when nitride 48 was stripped. In certain embodiments, about 1500 Å of polysilicon 58 is deposited. Polysilicon 58 can be used to create a gate, source, and/or drain of a transistor.

Figure 2K:
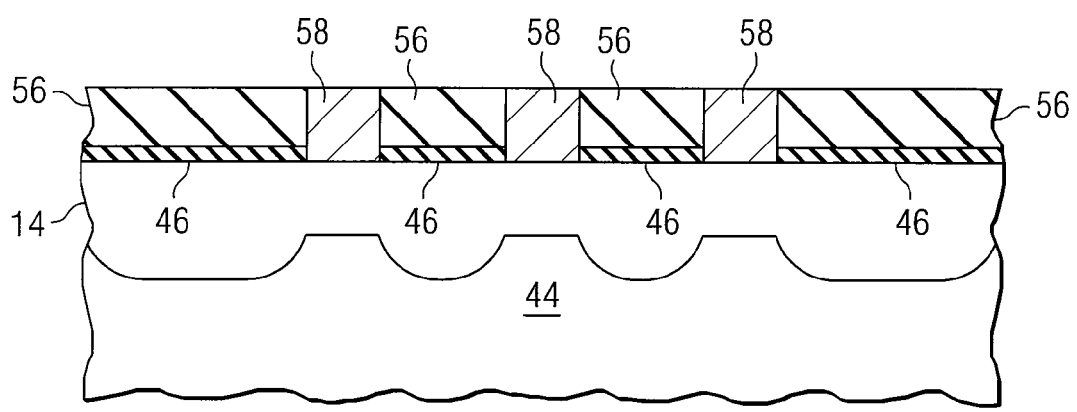

In FIG. 2K, device 40 can be polished again, using a CMP process in certain embodiments. This CMP process can be used to remove a portion of polysilicon 58, using the second layer of oxide 56 as an etch stop. The result after this polish is device 40 in FIG. 2K, which comprises three pillars of polysilicon 58 separated by the second layer of oxide 56. These pillars of polysilicon 58 can be doped using any suitable method to create gate, source, and/or drain contacts of a transistor. For example, a gate can be implanted, and a source and/or drain can be created using diffusion through the polysilicon 58.

Using a technique such as the one described here allows a device to be manufactured with a thin channel while reducing the chance that the channel will be cut off due to overetch during the manufacturing process. In previous methods, polysilicon is deposited onto a channel of a transistor and then gate, source, and/or drain contacts are created by etching the polysilicon so that distinct, unconnected contacts remain. In the present disclosure, layers of oxide and nitride are used to create chasms into which polysilicon can be deposited. These chasms are created without overetching into the channel. These chasms are in the shape of the gate, source, and/or drain contacts, so when the polysilicon is deposited the contact is created and a polysilicon etch is not necessary. Therefore the step of overetching into the channel to create the polysilicon contacts has been removed from the process, and a semiconductor device with a thin channel can be created without fear of etching through the channel.

Although the present disclosure has been described with several embodiments, a myriad of changes, variations, alterations, transformations, and modifications may be suggested to one skilled in the art, and it is intended that the present disclosure encompass such changes, variations, alterations, transformations, and modifications as fall within the scope of the appended claims.

What is claimed is:

1. A method for fabricating a semiconductor device, comprising:
    forming a channel of a transistor, wherein the channel has a first conductivity type;
    depositing a first layer of oxide on a least a portion of the channel;
    depositing a layer of nitride on the first layer of oxide;
    etching the nitride, wherein at least a portion of the layer of nitride is etched to the first layer of oxide;
    depositing a second layer of oxide on the layer of nitride and the first layer of oxide;
    planarizing the second layer of oxide to expose at least a portion of the layer of nitride;
    stripping at least a portion of the layer of nitride to create one or more notches and to expose at least a portion of the first layer of oxide;
    removing at least a portion of the first layer of oxide; and
    depositing a layer of polysilicon, wherein at least a portion of the layer of polysilicon is deposited into one or more notches created by stripping at least a portion of the layer of nitride.

2. The method of claim 1, wherein the method further comprises planarizing the polysilicon and at least a portion of the second layer of oxide.

3. The method of claim 1, wherein forming a channel of a transistor comprises forming a channel in a shallow trench isolation structure.

4. The method of claim 1, wherein the first layer of oxide comprises a thickness at least 10 Å.

5. The method of claim 1, wherein the layer of nitride is at least 300 Å.

6. The method of claim 5, wherein the second layer of oxide is at least 900 Å.

7. The method of claim 1, further comprising implanting a second conductivity doping type in the polysilicon residing within at least one of the one or more notches.

8. The method of claim 1, further comprising doping the polysilicon with material of a first conductivity type.

9. The method of claim 1, wherein planarizing the oxide comprises using a chemical-mechanical planarization process.

10. The method of claim 1, wherein etching the nitride comprises using a photoresist.

11. The method of claim 1, wherein the depth of the channel of the transistor is less than 400 Å.

12. The method of claim 1, wherein etching the nitride comprises stopping the nitride etch before etching into the channel of a transistor to prevent channel cut-off.

13. The method of claim 1, wherein planarizing the oxide to expose at least a portion of the layer of nitride comprises using nitride as an etch stop layer.

14. The method of claim 1, wherein planarizing the polysilicon and at least a portion of the second layer of oxide comprises using oxide as an etch stop layer.

15. A method for fabricating a semiconductor device, comprising:

forming a channel of a transistor, wherein the channel has a first conductivity type;

depositing a first layer of oxide on at least a portion of the channel;

depositing a layer of nitride on the layer of oxide;

etching the nitride, wherein at least a portion of the layer of nitride is etched to the first layer of oxide and the first layer of oxide stops the nitride etch before etching into the channel;

depositing a second layer of oxide on the layer of nitride and the first layer of oxide;

planarizing the second layer of oxide to expose at least a portion of the layer of nitride;

stripping at least a portion of the layer of nitride to create one or more notches and to expose at least a portion of the first layer of oxide;

removing at least a portion of the first layer of oxide;

depositing a layer of polysilicon, wherein at least a portion of the layer of polysilicon is deposited into one or more notches created by stripping at least a portion of the layer of nitride; and planarizing the polysilicon and at least a portion of the second layer of oxide.

16. The method of claim 15, wherein the depth of the channel of the transistor is less than 400 Å.

* * * * *